United States Patent [19]

Takahashi et al.

[11] Patent Number: 5,452,400
[45] Date of Patent: * Sep. 19, 1995

[54] METHOD OF OPTIMIZING A COMBINATION USING A NEURAL NETWORK

[75] Inventors: Masanobu Takahashi; Kazuo Kyuma, both of Amagasaki, Japan

[73] Assignee: Mitsubishi Denki Kabushiki Kaisha, Tokyo, Japan

[*] Notice: The portion of the term of this patent subsequent to May 16, 2012 has been disclaimed.

[21] Appl. No.: 212,421

[22] Filed: Mar. 11, 1994

Related U.S. Application Data

[63] Continuation of Ser. No. 308,637, Sep. 19, 1994, Pat. No. 5,416,889, which is a continuation of Ser. No. 925,605, Aug. 4, 1992, abandoned.

[30] Foreign Application Priority Data

Aug. 30, 1991 [JP] Japan ................................. 3-219571

[51] Int. Cl.$^6$ .............................................. G06F 15/18
[52] U.S. Cl. ......................................... 395/22; 395/23; 395/24; 364/491
[58] Field of Search ...................... 395/21, 22, 23, 24, 395/920, 921; 364/491, 555, 142

[56] References Cited

U.S. PATENT DOCUMENTS

| | | | |
|---|---|---|---|
| 4,495,559 | 1/1985 | Gelatt et al. | 364/142 |
| 4,660,166 | 4/1987 | Hopfield | 395/24 |
| 4,874,963 | 10/1989 | Alspector | 395/24 |
| 5,200,908 | 4/1993 | Date et al. | 395/21 |

OTHER PUBLICATIONS

Neuroport: Neuro Computing for multi objective design optimization for printed circuit board component placement Joseph Natt, IEEE/Jun. 1989.
A Modified Hopfield Network for two-dimensional module placement Sriram et al. IEEE/May 1990.
Diagnosis of Telephony Line Cord Component Failure using an artificial NN Thompson et al IEEE/Apr. 1991.
A NN Design for circuit partitioning YIH et al., IEEE Dec., 90.
"Improvement of Performance of Leaning in Boltsman Machine and Application to Reorganization Optimization Problem", Research Materials for System Control Study Meeting, the Institute of Electrical Engineers of Japan, SC-91-2, pp. 17 to 18.

*Primary Examiner*—Allen R. MacDonald
*Assistant Examiner*—Richemond Dorvil
*Attorney, Agent, or Firm*—Wolf, Greenfield & Sacks

[57] ABSTRACT

A neural network for solving the problem of the optimization of the arrangement of at least two parts which are combined with each other through connecting wires. One neuron is assigned to each part. Each neuron has a synapse with a weight. Weights of the synapses of a neuron are initially set, and a learning process is repeated a while satisfying restricting conditions. In the learning process, the fittest neurons for all the coordinates of the positions at which the parts are disposed are selected in accordance with a predetermined standard while serially updating the weights of the synapses of the neurons so as to satisfy the restricting conditions. After the fittest neurons for all the coordinates of the positions are selected, judgment is made as to whether or not the arrangement obtained in the current learning cycle is closer to an optimal arrangement than any other arrangement which has been obtained in previous learning cycles. The optimal arrangement obtained from a set of learning cycles is provided as an indication of a quasi-optimal arrangement.

85 Claims, 5 Drawing Sheets

METHOD OF OPTIMIZING A COMBINATION USING A NEURAL NETWORK

CROSS-REFERENCE TO RELATED APPLICATIONS

This application is a continuation of application Ser. No. 08/308,637, filed Sep. 19, 1994, U.S. Pat. No. 5,416,889 which is a continuing application and claims the benefit under 35 U.S.C. §120 of U.S. patent application Ser. No. 07/925,605, filed Aug. 4, 1992, now abandoned.

BACKGROUND OF THE INVENTION

1. Field of the Invention

The present invention relates to a method of optimizing an arrangement of parts or the like.

2. Description of Related Art

A part arrangement optimization problem will first be explained. If it is assumed, for example, that the positions for arranging four parts and the number of wires between the respective parts are given as shown in Table 1, the parts arrangement optimization problem is how the parts should be arranged in order to make the total length of wiring the shortest.

TABLE 1

|  |  | Number of Parts | | | |
|---|---|---|---|---|---|
|  |  | 1 | 2 | 3 | 4 |
| Number | 1 | 0 | 3 | 3 | 1 |
| of | 2 | 3 | 0 | 1 | 3 |
| parts | 3 | 3 | 1 | 0 | 3 |
|  | 4 | 1 | 3 | 3 | 0 |

Examples of the optimal solution and a non-optimal solution to this problem are shown in FIGS. 4a and 4b, respectively. In FIGS. 4a and 4b, the reference numeral 5 represents a part and 6 a wire. The arrangement shown in FIG. 4a is the optimal arrangement and the arrangement shown in FIG. 4b is an example of a non-optimal solution because the total length of wiring is longer than that in FIG. 4a. There is no analytical solution for the part arrangement optimization problem, and it is necessary to examine all the arrangements in order to attain the optimal solution. However, since there are N! combinations for the arrangement of N parts, if N increases, the calculation time for reaching the optimal solution increases enormously. In other words, the part arrangement optimization problem is a kind of combination optimization problem. Therefore, the object of solving this problem is generally to reach an approximate solution, which is approximate to the optimal solution, at a high speed.

FIG. 5 is a flowchart showing a conventional part arrangement optimization method which is described in Takahashi, W. Balzer, Kyuma: *Improvement of Performance of Learning in Boltzmann Machine and Application to Recognition and Optimization Problem* (Research Materials for System Control Study Meeting, the Institute of Electrical Engineers of Japan, SC-91-2, pp. 17 to 18, Mar. 19, 1991), and which uses a Boltzmann machine model, one of the mutual combination type neural network models.

The conventional method will now be explained. This method is used to (approximately) optimize the arrangement of N parts when N parts (part numbers 1 to N) and N positions (position numbers 1 to N) are given one neuron is allotted to each combination (there are $N^2$ combinations) of a position number and a part number (step ST14). For example, Table 2 shows an example of the allotment of 4 parts.

TABLE 2

|  |  | Position number | | | |
|---|---|---|---|---|---|
|  |  | 1 | 2 | 3 | 4 |
| Number | 1 | $n_1$ | $n_2$ | $n_3$ | $n_4$ |
| of | 2 | $n_5$ | $n_6$ | $n_7$ | $n_8$ |
| parts | 3 | $n_9$ | $n_{10}$ | $n_{11}$ | $n_{12}$ |
|  | 4 | $n_{13}$ | $n_{14}$ | $n_{15}$ | $n_{16}$ |

The symbol $n_i$ represents an i-th neuron. In this case $N^2$ neurons are used and the state of each neuron represents whether a certain part is disposed at a certain position. For example, the fact that $n_{10}$ is in the excited state (the output of the neuron $n_{10}$ is "1") means that the part 3 is disposed at the position 2. This introduces the following restricting conditions to the state of a neuron. That is, since one part can be disposed only at one position at one time, only one of the four neurons in each row in Table 1 can assume the excited state at one time. Since only one part can be disposed at one position at one time, only one of the four neurons in each column in Table 1 can assume the excited state at one time. The weight of a combination between neurons is then determined in accordance with the following equation (step S14):

$$W_{ij} = c_1 W_{ij}^c + c_2 W_{ij}^s \quad (1)$$

The symbol $W_{ij}$ represents the synaptic weight from a neuron j to i, and $c_1$ and $c_2$ are constants. The symbol $W_{ij}s$ represents the above-described restricting condition, namely, the suppressive (negative) weight for mutually suppressing the excitation between the neurons in the row and in the column so as to maintain the excited state of only one neuron in one row and in one column. The symbol Wijc represents the weight which reflects the total length of wiring, and is obtained from the following equation:

$$W_{ij}^c = c_3 - h_{p_i,p_j} d_{q_i,q_j} \quad (2)$$

wherein $c_3$ is a constant $h_{p_i,p_j}$ represents the number of wires between parts $p_i$ and $p_j$, and $d_{q_i,q_j}$ represents the distance between positions $q_i$ and $q_j$, wherein $p_i$ is the residual when i is divided by N, and $q_i$ is the quotient. If $W_{ij} = W_{ji}$, in a mutual combination type neural network model like this example, the energy E of the network is defined by the following equation:

$$E = \sum_{i,j} \{-W_{ij} V_i V_j\} \quad (3)$$

wherein Vi represents the output (excited state: "1", non-excited state: "0") of the i-th neuron. If the weight $W_{ij}$ is determined in accordance with the equations (1) and (2), the energy E is represented as follows:

$$E = c_2 \cdot (\text{total length of wiring}) + (\text{constant}) \quad (4)$$

The energy E does not change or is reduced when the state of the neurons are updated. Therefore, when the states of the neurons are updated serially, the state of the network becomes stable in the state in which the energy E is the minimum. The state of the neurons at this time determines the arrangement of the parts which minimizes the energy E and, hence, which makes the total length of wiring the shortest, as is obvious from the equation (4). Actually, the minimal point of the energy is obtained by using a technique called a simulated annealing method, which updates the state of the neurons stochastically in order to avoid the influence of a local stable point (minimal point) of the energy (step S16). The arrangement of the parts is determined on the basis of the state of the neurons at that time (step S17). This arrangement is the (quasi-)optimal solution.

In the conventional part arrangement optimization method described above, since $N^2$ neurons and $N^4$ weights are necessary for solving the problem for N parts, if the problem is solved by a computer, the memory capacity and the calculation time which are proportional to $N^4$ are necessary, so that this method cannot be applied to a large-scale problem in which the number of parts is large.

SUMMARY OF THE INVENTION

According to this structure, the number of neurons which are necessary for solving the part arrangement optimization problem for N parts is reduced to N. The number of synapses is proportional to N. For example, in the case of determining the two-dimensional arrangement of the N parts, the required number of synaptic weights is 2N and in the case of determining the three-dimensional arrangement of the N parts, the required number of synaptic weights is 3N. The memory capacity and the calculation time required for a computer are therefore reduced, thereby enabling the solution of a large-scale problem in which the number of parts is large.

In the present invention, the part arrangement optimization problem for at least two parts, which are connected through connecting wires, is solved by assigning a neuron to each part, wherein each neuron has a synapse with a weight. The weights are initially set to preferably random values near the center of the search space. A learning process is repeated a number of times after the weights of the synapses are initially set, during which weights of the synapses are updated on the basis of restricting conditions. In this learning process, a fittest neuron is selected for each position at which the parts are disposed. This selection is made in accordance with a predetermined standard. In this arrangement, each part is placed at the position for which its neuron is selected as the fittest neuron. In this process the weights of a selected fittest neuron become approximate to the position at which the part assigned to that neuron is to be disposed.

The arrangement obtained in a current learning cycle is kept as a quasi-optimal arrangement if it is closer to an optimal arrangement than any other arrangement which has been obtained in previous learning cycles after the fittest neurons for all the coordinates of the positions are selected.

The features and advantages of the present invention will become clear from the following description of the preferred embodiment thereof, taken in conjunction with the accompanying drawings.

DESCRIPTION OF THE PREFERRED EMBODIMENT

The present invention will now be explained with reference to an embodiment.

Figure 1A:
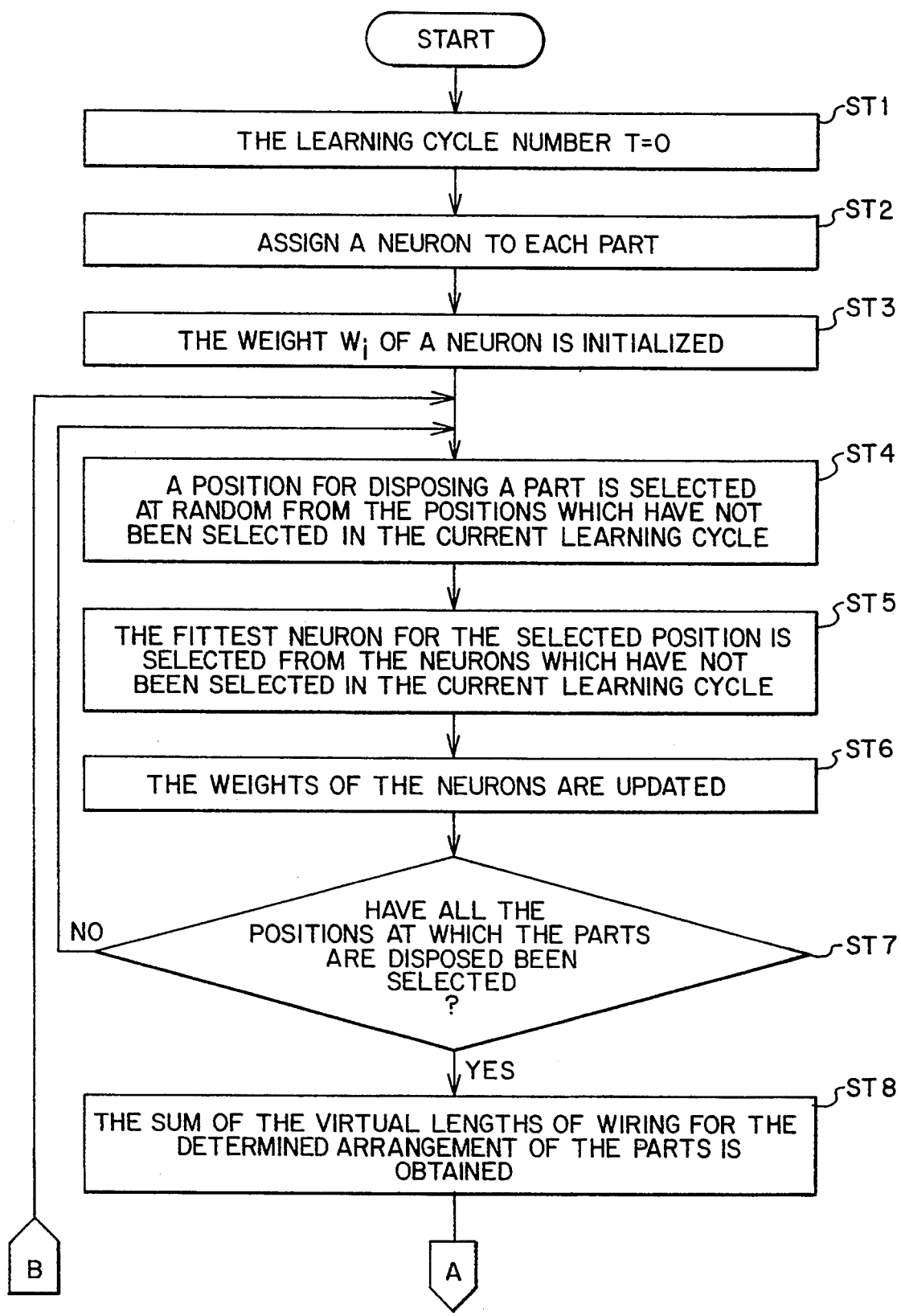
FIGS. 1a and 1b are flowcharts of a part arrangement optimization method in an embodiment of the present invention.
Figure 1B:
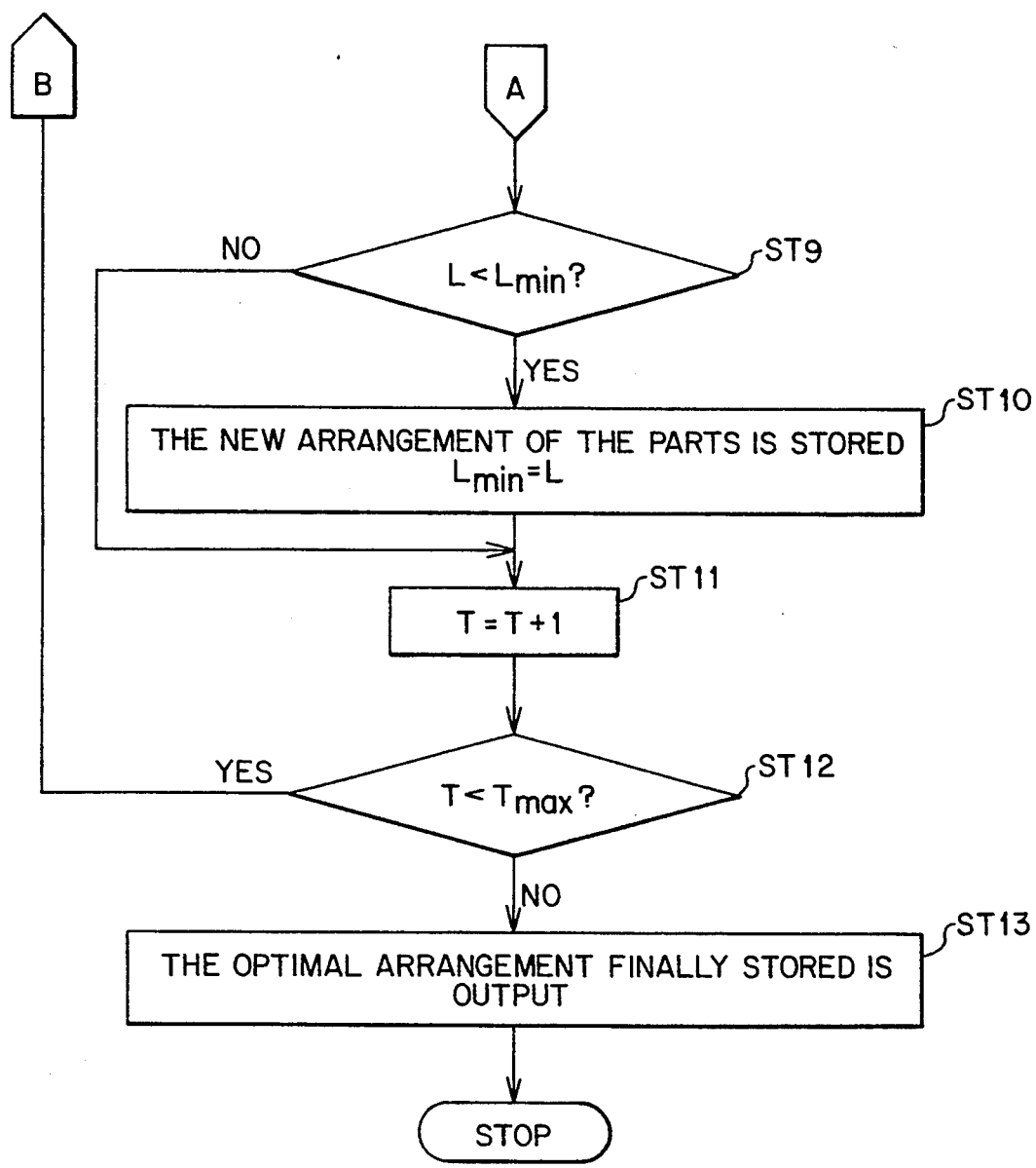
Figure 2:
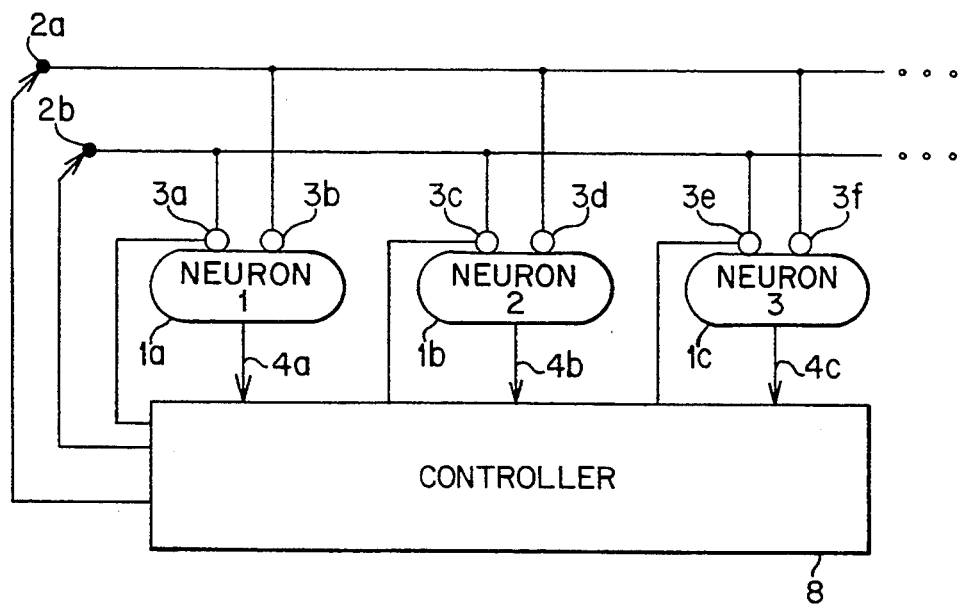
FIG. 2 shows the structure of a neural network model in this embodiment.
Figure 3:
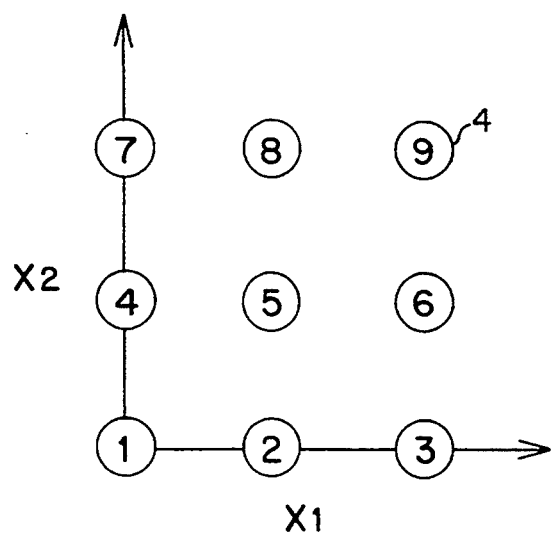
FIG. 3 is an explanatory view of an example of the positions at which 9 parts are disposed in this embodiment.

FIGS. 1a and 1b are flowcharts of a part arrangement optimization method in an embodiment of the present invention. In this embodiment, N neurons are used for solving the problem for N parts, where N is an integer equal to or larger than 2. Otherwise, there is no problem of optimizing the part arrangement. One neuron is allotted to each part. It is now assumed that an i-th neuron is allotted to an i-th part. In the case of arranging parts two-dimensionally, a neuron has two input lines. Position coordinates are provided for each input line, as will be described later. The neuron i has a two-dimensional weight $W_i=(W_{i1}, W_{i2})$ [i=1 to N], corresponding to each input line. FIG. 2 shows a neural network model in this embodiment. In FIG. 2, the reference numerals 1a, 1b and 1c represent neurons, 2a, 2b input lines and 3a to 3f synapses having the weights $W_{i1}$, $W_{i2}$ of the neurons. In the case of using N parts, N possible positions at which the N parts are disposed are determined in advance. FIG. 3 is an example of the positions at which 9 parts are disposed. In FIG. 3, the reference numeral 4 represents the position at which a certain part is disposed, wherein a circle represents the center position at which a certain part is disposed, and the number in the circle represents the position number. The coordinates of each position are represented by $X_i=(X_{i1},X_{i2})$ [i=1 to N]. The output 4a–4c of each neuron 1a–1c provides a measure of the difference, similarity, or comparison of the input $X_{i1}$, $X_{i2}$ with the weight of the neuron, for example, the neuron may output the ordered pair $(X_{i1}-W_{i1}, X_{i2}-W_{i2})$. A controller 8 is connected to the outputs 4a–4c, input lines 2a–2b and synapses 3a, 3c and 3e so as to control the neural network in accordance with this method.

Although the parts are arranged in a two-dimensional lattice, in the embodiment as shown in FIG. 3, the arrangement is not restricted thereto and may be determined as desired. For example, the arrangement may be three-dimensional. Thus, this description can be generalized to more than two dimensions where $$X_i=(x_{i1}, X_{i2} \ldots X_{in}).$$

The part arrangement optimization method of this embodiment will now be explained with reference to FIG. 1. The learning cycle number T is first set to "0" (step ST1). A neuron is then assigned to each part (step ST2). The weight Wi of a neuron is then initialized, ordinarily, at a random number (step ST3). The part arrangement derived as the solution does not depend upon the initial weights. For instance, the initial weights can be chosen at random, or all the initial weights may be the same. No uniqueness in the initial weights is necessary. In one embodiment, the initial weights are set at random so as to be distributed near the center of the search space.

After the weights are initially set, a first learning cycle is executed. In the first learning cycle, a position S for disposing a part is selected at random from the positions which have not been selected in this learning cycle (step ST4). The position coordinates $X_s$ of the selected position S are input from the input lines 2a and 2b, and the neuron having the weight closest to that of the input signal (this neuron is called the fittest neuron) is selected from the neurons which have not been selected in this learning cycle (step ST5). The number b of the fittest neuron may be represented by the following equation (5a):

$$b = \underset{i \in U}{\operatorname{argmin}}(\|X_s - W_i\|^2) \qquad (5a)$$

wherein U represents the set of neuron numbers which have not been selected in this learning cycle. For example, if a b-th neuron is selected as the fittest neuron for the position S, this means that the b-th part is disposed or arranged at the position S. During the learning cycles the position S is assigned to the b-th part. An actual physical placement of the b-th part at position S may be performed at a later time.

The number b of the fittest neuron may also be determined, for example, in accordance with the following equation (5b):

$$b = \operatorname{argmin}(\|X_s - W_i\|^2 + E(s, i))$$

wherein $X_s$ represents the position coordinates selected by the signal inputting means, $W_i$ the weights of the synapses of an i-th neuron, i the number of a neuron which has not been selected in the current learning cycle, and E(s,i) is a cost function where a part assigned to the i-th neuron is provisionally positioned at the s-th position. The cost function is determined in accordance with restricting conditions. For example, if it is desired to make it difficult to position a part (assigned to a neuron p) at a position r, E(r,p) is set to be large. On the other hand, if it is desired to make it easy to position the part assigned to a neuron p at the position r, E(r,p) is set to be small, e.g., a negative value.

In consideration of restricting conditions, the weights of the neurons are updated by the amount of update represented by the following equations (6) and (7) at the next step (ST 6):

$$\Delta W_i = (X_s - W_i) \cdot \epsilon \cdot f(i, b) \qquad (6)$$

$$f(i, b) = \begin{matrix} 1 & \text{for } i = b \\ \alpha \cdot h_{ib} & \text{for } i \neq b \end{matrix} \qquad (7)$$

wherein e is a constant called a learning rate and is ordinarily set to be not more than 1, and f(i, b) is 1 when the i-th neuron is the fittest neuron and $\alpha \cdot h_{ib}$ in the other cases, wherein $\alpha$ is a constant called a wiring constant. The constant a is usually equal to or larger than 0 and is equal to or smaller than 1 (i.e., $0 \leq \alpha \leq 1$). A preferable value of a $\alpha$ depends upon a part arrangement problem to be solved. Further, $\alpha$ should be variable among learning cycles. The expression $h_{ib}$ represents the number of connecting wires between the i-th part and a b-th part. Thus, what are updated are the weights of the synapses of the fittest neuron just previously determined and the weights of the synapses of neurons assigned to parts which are wired to the part assigned to the fittest neuron. Although a two-dimensional value is used in the embodiments, the present invention is also applicable to any dimensions such as three dimensions.

The following equation (8) may also be used instead of equation (7) when $i \neq b$ $$f(i,b) = \alpha \cdot h_{ib} + \Sigma_j(\alpha \cdot h_{jb} \times \alpha' \times h_{ij}) \qquad (8)$$

where $\alpha'$ is a constant, j is a positive integer representing a j-th neuron, $h_{jb}$ is the number of connecting wires between a j-th part and a b-th part, and hij is the number of connecting wires between an i-th part and a j-th part. When this equation is used, influences applied via other parts can be taken into account. That is, Equation 8 is helpful in quickly optimizing the respective weights of the neurons because it considers those neurons which are connected to neurons connected to a selected fittest neuron.

Figure 4A:
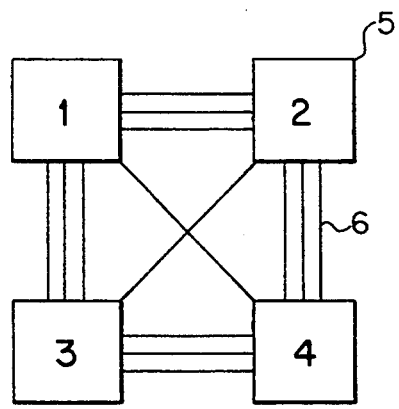
FIGS. 4a and 4b are explanatory views of examples of the optimal arrangement and a non-optimal arrangement of parts when the number of wires connecting the parts is given, as shown in Table 1.
Figure 4B:
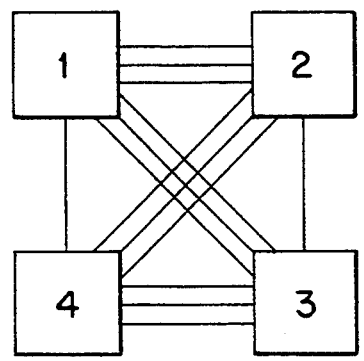
Figure 5:
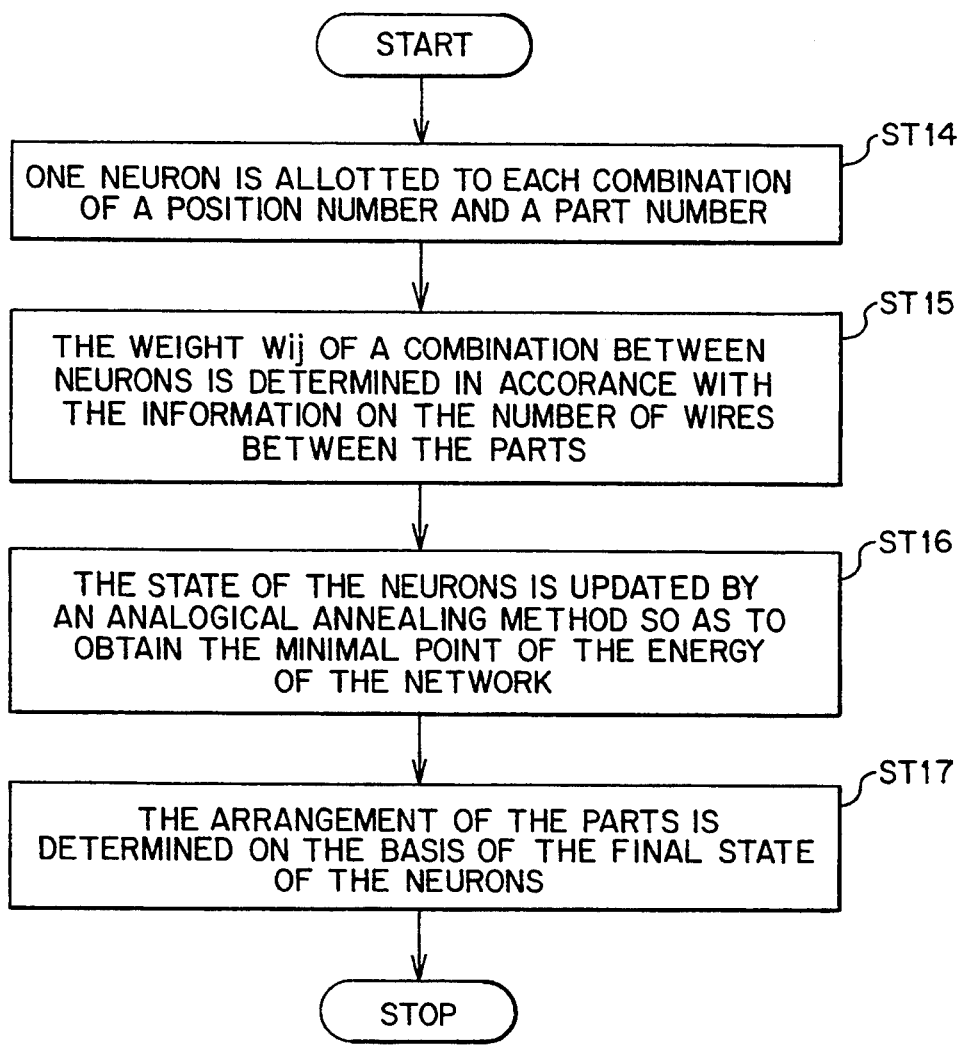
FIG. 5 is a flowchart of a conventional part arrangement optimization method.

A judgment is then made as to whether or not all the positions at which the parts are disposed have been selected in this learning cycle (step ST7). If not all positions have been selected, the process continues with the step of selecting of a position at which a part should be disposed (step ST4). On the other hand, if all of the positions have been selected, the sum L of the virtual lengths of wiring for the determined arrangement of the parts is determined (step ST8). If the arrangement is that shown in FIG. 4a, for example, the virtual length of wiring is calculated as the sum of the distances in the horizontal direction (X) and in the vertical direction ($X_2$) of two adjacent positions at which parts are disposed.

The sum L of the virtual lengths of wiring obtained is then compared with the minimum sum $L_{min}$ of the virtual lengths of wiring obtained in the previous learning cycles (step ST9). If L is not smaller than $L_{min}$ the process proceeds to step ST11, while if L is smaller than $L_{min}$ the new arrangement of the parts obtained in this learning cycle is stored as the optimal arrangement, and L is substituted into $L_{min}$ as the minimum sum of the virtual lengths of wiring (step ST10). The first learning cycle is thus ended. At the next step (ST11), "1" is added to the learning cycle number T. The learning cycle number T is then compared with a predetermined maximum number of times $T_{max}$ for learning (step ST11). If T has not reached $T_{max}$, the process returns to step ST3 so as to start the next learning cycle. If T is $T_{max}$, the arrangement of the parts which is finally stored as the optimal arrangement is output as the intended (sub)optimal arrangement (step ST13).

Alternatively, the learning process can be terminated when the total length of wiring L is less than a predetermined threshold. As yet a further alternative, the learning process can be terminated when the total length of wiring L for successive repetitions of the learning cycle fails to realize any significant improvement. That is, if the difference between L for a given learning cycle and $L_{min}$ is small for a series of learning cycles, the learning process may be terminated.

In the above embodiment, the number of positions is equal to the number of parts, but it is possible to similarly optimize the arrangement of parts at positions the number of which is larger than the number of parts by considering dummy parts which are not connected to any other part.

Although the order of selecting the positions at which the parts are disposed is random in this embodiment, the order may be determined in accordance with some standard. The two parameters $\epsilon$ and $\alpha$, which are fixed at certain values in this embodiment, may be changed during a learning cycle.

The weights are updated in accordance with the equations (6) and (7) in this embodiment, but these equations are not strictly limiting. For example, a certain change such as the removal of $(X_i - W_i)$ from the equation (6) and a change of "1" on the right-hand side of the equation (7) to "2" similarly enables the optimization of the part arrangement.

Although only the reduction in the total length of wiring as much as possible is aimed at in this embodiment, the optimization of the arrangement of parts including other conditions (e.g., avoidance of crowded wiring and avoidance of the deposition of a specific part at an adjacent position) is also possible. For this purpose, the terms reflecting these conditions may be introduced into the equation (5), for example, and the fittest neuron is selected so as to satisfy these conditions at the step ST 5.

Although the neuron having the weight closest to that of an input signal is selected when the fittest neuron is selected in this embodiment, another neuron may be selected at a certain probability by introducing a noise term into the equation (5), for example. By such a stochastic fluctuation, the abilities of finding the optimal solutions to some problems are enhanced.

As described above, according to the present invention, a method of optimizing the arrangement of at least two parts thus involves allotting a neuron to each part, setting the weights of each neuron, then inputting the coordinates of a position at which a part should be disposed to a neuron as an input signal. A fittest neuron for the input signal is then selected on the basis of a preset standard. The weights of the neurons are updated in accordance with restricting conditions. The weights of each neuron tend to approximate the position for which they were selected as the fittest neuron. These steps are repeated until all the positions for the N parts are selected. In this way, since the problem of arranging N parts at optimal positions is solved by using N neurons and the weight of the synapses of these neurons, it is possible to solve a large-scale problem in which the number of-parts is large and to greatly reduce the cost (for the calculation time and the memory capacity).

This embodiment is applied to a part arrangement optimization problem, but the present invention is not restricted thereto. For example, the present invention is applicable to arrangement of switch boards in a factory or a plant.

Further, when there are parts which are always arranged at constant positions, neurons assigned to these parts can be continuously selected as the fittest neuron for the part arrangement in question.

It will be understood that there are many ways to implement this invention. In particular, the invention could be implemented using a general purpose computer, such as an engineering workstation, which would be programmed to implement an appropriate neural network and controller using a computer programming language, for example, C. A parallel computer, such as those available from Cray, may also be used. The neural network and controller may also be implemented with special purpose hardware circuits.

Having now described an embodiment of the invention, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention as defined by the appended claims and equivalents thereto.

What is claimed is:

1. A method utilizing a neural network for solving a problem of optimizing an arrangement of a plurality of interconnected parts among N positions in M dimensions, the neural network having a plurality of neurons, each neuron having at least one input, each input having a synapse, each synapse having a weight, a composite weight being formed for a neuron as an ordered combination of the weight of each synapse of the neuron, the method comprising the steps of:
   a) assigning each of the plurality of neurons to a different part, of the plurality of parts;
   b) initializing the weight of each synapse of each neuron; and
   c) determining an arrangement of parts by performing a learning cycle, the learning cycle comprising the steps of:
      i) inputting a position coordinate indicative of one of the N positions to the inputs of a set of neurons, of the plurality of neurons;
      ii) generating, for each neuron of the set of neurons, a similarity value responsive to the input coordinate to a neuron and the composite weight of the neuron;
      iii) selecting a fittest neuron, from the set of neurons, whose similarity value is an extreme value across the set of neurons;
      iv) updating the weight of each synapse of the neurons of the set of neurons; and
   d) repeating the steps c)i through c)iv until all of the plurality of neurons have been selected as a fittest neuron.

2. The method of claim 1, wherein the similarity value is a function of a difference between the position coordinate and the composite weight of a neuron.

3. The method of claim 2, wherein the similarity value is a function of a squared Euclidian distance between the position coordinate and the composite weight.

4. The method of claim 1, wherein the similarity value is further a function of a restricting condition.

5. The method of claim 4, wherein the restricting condition biases a predetermined neuron to be positioned at a predetermined position of the N positions.

6. The method of claim 4, wherein the restricting condition biases a predetermined neuron to be excluded from a predetermined position of the N positions.

7. The method of claim 1, wherein each neuron has M inputs, one for each of the M dimensions.

8. The method of claim 7, wherein M equals two or three.

9. The method of claim 1, further including the step of updating the set of neurons, after the step of selecting a fittest neuron, to exclude the fittest neuron from the set of neurons.

10. The method of claim 1, further including the step of assigning the part to which the fittest neuron is assigned to the position indicated by the position coordinate.

11. The method of claim 10, wherein the learning cycle further includes the step of determining a total wiring length for the arrangement of parts determined by the learning cycle.

12. The method of claim 11, further including the step of repeating the learning cycle a plurality of times.

13. The method of claim 12, wherein the learning cycle is repeated a predetermined number of times, and wherein a quasi-optimal arrangement is selected as the arrangement yeilding a minimum total wiring length.

14. The method of claim 12, wherein the learning cycle is repeated until a total wiring length is obtained for an arrangement that is less than a predetermined threshold.

15. The method of claim 12, wherein a learning cycle is repeated until successive repetitions of the learning cycle fail to realize any significant reduction in the total wiring length.

16. The method of claim 1, wherein the step of initializing the weight of each synapse of each neuron includes initializing the weight to a random value.

17. The method of claim 1, wherein the step of updating the weight of each synapse of a neuron includes changing the weight by an amount $\Delta W_i$ equal to a product of a wiring function, $f(i,b)$, and a difference between the input position and the composite weight of the neuron.

18. The method of claim 17, wherein the wiring function for the fittest neuron is a constant.

19. The method of claim 18, wherein the wiring function for a neuron other than the fittest neuron is proportional to a number of connecting wires between a part assigned to the neuron and a part assigned to the fittest neuron.

20. The method of claim 19, wherein $$\Delta W_i = (X_s - W_i) \cdot \epsilon \cdot f(i, b),$$

wherein $$f(i, b) = 1 \quad \text{for } i = b \text{ and}$$
$$= \alpha \cdot h_{ib} \quad \text{for } i \neq b,$$

wherein $\epsilon$ is a learning rate constant between zero and one, $f(i, b)$ is 1 when the i-th neuron is the fittest neuron and $\alpha \cdot h_{ib}$ in the other cases, $h_{ib}$ represents a number of connecting wires between the i-th part and a b-th part, and $\alpha$ is a wiring constant.

21. The method of claim 20, wherein $\alpha$ is between zero and one.

22. The method of claim 21, wherein multiple learning cycles are performed, and wherein $\alpha$ is varied between learning cycles.

23. The method of claim 20, wherein $\epsilon$ is a selectable constant.

24. The method of claim 19, wherein the wiring function for a neuron other than the fittest neuron is further indicative of a number of interconnecting wires between the part assigned to the fittest neuron and a plurality of other parts.

25. The method of claim 24, wherein the wiring function for a current neuron other than the fittest neuron is further indicative of a number of interconnecting wires between the part assigned to the current neuron and a plurality of other parts.

26. The method of claim 25, wherein the wiring function $$f(i,b) = \alpha \cdot h_{ib} + \Sigma_j (\alpha \cdot h_{jb} \times \alpha' \times h_{ij})$$

wherein $h_{ib}$ represents a number of connecting wires between the i-th part and a b-th part, $\alpha$ is a wiring constant, $\alpha'$ is a constant, j is a positive integer representing a j-th neuron, $h_{jb}$ is the number of connecting wires between a j-th part and a b-th part, and $h_{ij}$ is the number of connecting wires between an i-th part and a j-th part.

27. The method of claim 1, implemented on a general purpose computer using a computer programming language.

28. The method of claim 1, implemented on a parallel computer.

29. The method of claim 1, implemented with a special purpose hardware circuit.

30. The method of claim 1, wherein the step of inputting a position coordinate includes selecting the position coordinate from one of the N positions which have not been previously selected in the learning cycle.

31. A computer-implemented neural network system for arranging a plurality of parts among N positions in M-dimensions, including a plurality of neurons, wherein each neuron has M inputs, each input having a synapse, each synapse having a weight, and each neuron having an output indicative of similarity of the inputs to the weights, the parts being combined with one another through a set of connecting wires, the neural network system comprising:
 means for assigning each of the plurality of neurons to a different part;
 means for initializing the weight of each synapse of each neuron; and
 means for executing a learning cycle, comprising:
  means for inputting a position coordinate to the inputs of the neurons, indicative of one of the N positions at which a part can be placed;
  means, responsive to the input position coordinate, for generating a similarity value for each neuron;
  means for selecting a fittest neuron, responsive to the similarity value for each neuron, wherein the fittest neuron is the neuron whose weights are most similar to the input position coordinate;
  means for updating the weights of the synapses of the plurality of neurons; and
  means for repetitively operating the means for inputting, means for generating, means for selecting, and means for updating, so that a fittest neuron is selected for each of the N positions.

32. The system of claim 31, wherein the similarity value is a function of a difference between the position coordinate and the composite weight of a neuron.

33. The system of claim 32, wherein the similarity value is a function of a squared Euclidian distance between the position coordinate and the composite weight.

34. The system of claim 31, wherein the similarity value is further a function of a restricting condition.

35. The system of claim 34, wherein the restricting condition biases a predetermined neuron to be positioned at a predetermined position of the N positions.

36. The system of claim 34, wherein the restricting condition biases a predetermined neuron to be excluded from a predetermined position of the N positions.

37. The system of claim 31, wherein each neuron has M inputs, one for each of the M dimensions.

38. The system of claim 37, wherein M equals two or three.

39. The system of claim 31, further including means for updating the set of neurons, after the step of selecting a fittest neuron, to exclude the fittest neuron from the set of neurons.

40. The system of claim 31, further including means for assigning the part to which the fittest neuron is assigned to the position indicated by the position coordinate.

41. The system of claim 40, wherein the learning cycle further includes the step of determining a total wiring length for the arrangement of parts determined by the learning cycle.

42. The system of claim 41, further including means for repeating the learning cycle a plurality of times.

43. The system of claim 42, wherein the learning cycle is repeated a predetermined number of times, and wherein a quasi-optimal arrangement is selected as the arrangement yeilding a minimum total wiring length.

44. The system of claim 42, wherein the learning cycle is repeated until a total wiring length is obtained for an arrangement that is less than a predetermined threshold.

45. The system of claim 42, wherein a learning cycle is repeated until successive repetitions of the learning cycle fail to realize any significant reduction in the total wiring length.

46. The system of claim 31, wherein means for initializing the weight of each synapse of each neuron includes initializing the weight to a random value.

47. The system of claim 31, wherein means for updating the weight of each synapse of a neuron includes updating the weight by an amount $\Delta W_i$ equal to a product of a wiring function, $f(i,b)$, and a difference between the input position and the composite weight of the neuron.

48. The system of claim 47, wherein the wiring function for the fittest neuron is a constant.

49. The system of claim 48, wherein the wiring function for a neuron other than the fittest neuron is proportional to a number of connecting wires between a part assigned to the neuron and a part assigned to the fittest neuron.

50. The system of claim 49, wherein $$\Delta W_i = (X_s - W_i) \cdot \epsilon \cdot f(i, b),$$

wherein $$f(i, b) = 1 \quad \text{for } i = b \text{ and}$$
$$= \alpha \cdot h_{ib} \quad \text{for } i \neq b,$$

wherein $\epsilon$ is a learning rate constant between zero and one, $f(i, b)$ is 1 when the i-th neuron is the fittest neuron and $\alpha \cdot h_{ib}$ in the other cases, $h_{ib}$ represents a number of connecting wires between the i-th part and a b-th part, and $\alpha$ is a wiring constant.

51. The system of claim 50, wherein $\alpha$ is between zero and one.

52. The system of claim 51, further including means for repeating learning cycles and means for urging $\alpha$ between learning cycles.

53. The system of claim 50, wherein $\epsilon$ is a selectable constant.

54. The system of claim 49, wherein the wiring function for a neuron other than the fittest neuron is further indicative of a number of interconnecting wires between the part assigned to the fittest neuron and a plurality of other parts.

55. The system of claim 54, wherein the wiring function for a current neuron other than the fittest neuron is further indicative of a number of interconnecting wires between the part assigned to the current neuron and a plurality of other parts.

56. The system of claim 55, wherein the wiring function $$f(i,b) = \alpha \cdot h_{ib} + \Sigma_j (\alpha \cdot h_{jb} \times \alpha' \times h_{ij})$$

wherein $h_{ib}$ represents a number of connecting wires between the i-th part and a b-th part, $\alpha$ is a wiring constant, $\alpha'$ is a constant, j is a positive integer representing a j-th neuron, $h_{jb}$ is the number of connecting wires between a j-th part and a b-th part, and $h_{ij}$ is the number of connecting wires between an i-th part and a j-th part.

57. The system of claim 31, implemented on a general purpose computer using a computer programming language.

58. The system of claim 31, implemented on a parallel computer.

59. The system of claim 31, implemented with a special purpose hardware circuit.

60. The system of claim 31, wherein the means for inputting a position coordinate includes means for selecting a position coordinate from one of the N positions which have not been previously selected in the learning cycle.

61. A computer system utilizing a neural network model for optimizing an arrangement of a plurality of parts among N positions of in M-dimensions, the parts being connected through a set of connecting wires, the computer system comprising:

a neural network having a plurality of neurons, wherein each neuron has M inputs, each input having a synapse, each synapse having a weight, each neuron having an output indicative of a similarity of the inputs to the weights, each neuron being assigned to a different part;

means for initializing the weight of each synapse of each neuron;

means for executing a learning process, comprising:

i) means for selecting one of the N positions and inputting a position coordinate identifying the selected position to the inputs of a set of neurons of the plurality of neurons;

ii) means, within each of the neurons, for generating a similarity value, responsive to the input position coordinate;

iii) means for selecting a fittest neuron from among the set of neurons, responsive to the similarity value of each neuron of the set of neurons, wherein the fittest neuron is the neuron whose weights are most similar to the input position coordinate; and iii) means for updating the weights of the synapses of the set of neurons according to a set of restricting conditions.

62. The system of claim 61, wherein the similarity value is a function of a difference between the position coordinate and the composite weight of a neuron.

63. The system of claim 62, wherein the similarity value is a function of a squared Euclidian distance between the position coordinate and the composite weight.

64. The system of claim 61, wherein the similarity value is a further a function of a restricting condition.

65. The system of claim 64, wherein the restricting condition biases a predetermined neuron to be positioned at a predetermined position of the N positions.

66. The system of claim 64, wherein the restricting condition biases a predetermined neuron to be excluded from a predetermined position of the N positions.

67. The system of claim 61, wherein the learning cycle further includes the step of determining a total wiring length for the arrangement of parts determined by the learning cycle.

68. The system of claim 67, further including the step of repeating the learning cycle a plurality of times.

69. The system of claim 68, wherein the learning cycle is repeated a predetermined number of times, and wherein a quasi-optimal arrangement is selected as the arrangement yeilding a minimum total wiring length.

70. The system of claim 68, wherein the learning cycle is repeated until a total wiring length is obtained for an arrangement that is less than a predetermined threshold.

71. The system of claim 68, wherein a learning cycle is repeated until successive repetitions of the learning cycle fail to realize any significant reduction in the total wiring length.

72. The system of claim 61, wherein the step of updating the weight of each synapse of a neuron includes changing the weight by an amount $\Delta Wi$ equal to a product of a wiring function, f(i,b), and a difference between the input position and the composite weight of the neuron.

73. The system of claim 72, wherein the wiring function for the fittest neuron is a constant.

74. The system of claim 73, wherein the wiring function for a neuron other than the fittest neuron is proportional to a number of connecting wires between a part assigned to the neuron and a part assigned to the fittest neuron.

75. The system of claim 74, wherein $$\Delta W_i = (Xs - W_i) \cdot \epsilon \cdot f(i,b),$$

wherein $$f(i, b) = 1 \quad \text{for } i = b$$
$$= \alpha \cdot h_{ib} \quad \text{for } i \neq b,$$

wherein $\epsilon$ is a learning rate constant between zero and one, f(i, b) is 1 when the i-th neuron is the fittest neuron and $\alpha \cdot h_{ib}$ in the other cases, $h_{ib}$ represents a number of connecting wires between the i-th part and a b-th part, and $\alpha$ is a wiring constant.

76. The system of claim 75, wherein $\alpha$ is between zero and one.

77. The system of claim 76, wherein multiple learning cycles are performed, and wherein $\alpha$ is varied between learning cycles.

78. The system of claim 75, wherein $\epsilon$ is a selectable constant.

79. The system of claim 74, wherein the wiring function for a neuron other than the fittest neuron is further indicative of a number of interconnecting wires between the part assigned to the fittest neuron and a plurality of other parts.

80. The system of claim 79, wherein the wiring function for a current neuron other than the fittest neuron is further indicative of a number of interconnecting wires between the part assigned to the current neuron and a plurality of other parts.

81. The system of claim 80, wherein the wiring function $$f(i,b) = \alpha \cdot h_{ib} + \Sigma_j (\alpha \cdot h_{jb} \times \alpha' \times h_{ij})$$

wherein $h_{ib}$ represents a number of connecting wires between the i-th part and a b-th part, $\alpha$ is a wiring constant, $\alpha'$ is a constant, j is a positive integer representing a j-th neuron, $h_{jb}$ is the number of connecting wires between a j-th part and a b-th part, and $h_{ij}$ is the number of connecting wires between an i-th part and a j-th part.

82. The system of claim 61, implemented on a general purpose computer using a computer programming language.

83. The system of claim 61, implemented on a parallel computer.

84. The system of claim 61, implemented with a special purpose hardware circuit.

85. The system of claim 61, wherein the means for selecting one of the N positions selects a position which have not been previously selected in the learning cycle.

* * * * *

UNITED STATES PATENT AND TRADEMARK OFFICE
CERTIFICATE OF CORRECTION

PATENT NO. : 5,452,400
DATED : Sep. 19, 1995
INVENTOR(S) : Takahashi et al.

It is certified that error appears in the above-indentified patent and that said Letters Patent is hereby corrected as shown below:

In the ABSTRACT: line 7, delete the word "a."

In the BACKGROUND OF THE INVENTION:

Column 1, line 67, please add a --.-- after the word "given."

Column 1, line 68, replace the word "one" with --One--.

Column 2, line 28, replace "S14" with --ST15--.

Column 2, line 39, replace "Wijc" with --$W^c_{ij}$--.

Column 2, line 56, replace "Vi" with --$V_i$--.

Column 3, line 8, replace "S16" with --ST16--.

Column 3, line 9, replace "S17" with --ST17--.

Column 4, line 31, replace "$W_{I2}$" with --$W_{i2}$--.

Column 4, line 62, replace "Wi" with --$W_i$--.

Column 5, line 16, move (5a) to the right of the equation found at line 18.

Column 5, line 34, add --(5b)-- to the right of the equation.

UNITED STATES PATENT AND TRADEMARK OFFICE
CERTIFICATE OF CORRECTION

PATENT NO. : 5,452,400
DATED : Sep. 19, 1995
INVENTOR(S) : Takahashi et al.

It is certified that error appears in the above-indentified patent and that said Letters Patent is hereby corrected as shown below:

Column 5, line 35, add --$i$-- under the word "argmin" of the equation.

Column 5, line 58, replace "e" with --$\epsilon$--.

Column 5, line 62, replace "a" with --$\alpha$--.

Column 6, line 14, replace "hij" with --$h_{ij}$--.

Column 6, line 51, replace "ST3" with --ST4--.

Column 7, line 12, replace "$X_i$" with --$X_s$--.

Signed and Sealed this

Twenty-fifth Day of June, 1996

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,452,400
DATED : Sep. 19, 1995
INVENTOR(S) : Masanobu Takahashi, et al It is certified that error appears in the above-indentified patent and that said Letters Patent is hereby corrected as shown below:

In column 5, rewrite equation 5a as follows:

$$-- \quad b = \underset{i \in U}{\operatorname{argmin}} (\|X_s - W_i\|^2) \quad (5a) \quad --.$$

Signed and Sealed this

Seventeenth Day of September, 1996

*Attest:*

BRUCE LEHMAN

*Attesting Officer*     *Commissioner of Patents and Trademarks*